(12) United States Patent
Veerabathini et al.

(10) Patent No.: US 12,113,353 B2
(45) Date of Patent: Oct. 8, 2024

(54) SYSTEMS AND METHODS TO CABLE SHIELD FAULT DETECTION AND PROTECTION

(71) Applicant: Maxim Integrated Products, Inc., San Jose, CA (US)

(72) Inventors: Anurag Veerabathini, Chandler, AZ (US); Punith Kumar Reddy Surkanti, Chandler, AZ (US); Jan F. Swidzinski, Gilbert, AZ (US); Kevin John Schemansky, Chandler, AZ (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 18/142,883

(22) Filed: May 3, 2023

(65) Prior Publication Data

US 2023/0275423 A1 Aug. 31, 2023

Related U.S. Application Data

(62) Division of application No. 17/233,829, filed on Apr. 19, 2021, now Pat. No. 11,689,012.

(60) Provisional application No. 63/017,630, filed on Apr. 29, 2020.

(51) Int. Cl.
| | |
|---|---|
| *H02H 7/22* | (2006.01) |
| *G01R 19/165* | (2006.01) |
| *G01R 31/12* | (2020.01) |
| *H02H 1/00* | (2006.01) |

(52) U.S. Cl.
CPC ....... *H02H 7/228* (2013.01); *G01R 19/16576* (2013.01); *G01R 31/1263* (2013.01); *H02H 1/0007* (2013.01)

(58) Field of Classification Search
CPC ................. H02H 7/228; H02H 1/0007; G01R 19/16576; G01R 31/263
See application file for complete search history.

(56) References Cited

U.S. PATENT DOCUMENTS

| 4,638,399 | A  | * | 1/1987  | Maroney ................ G01R 27/20 |
|---|---|---|---|---|
|  |  |  |  | 340/649 |
| 9,146,268 | B2 | * | 9/2015  | Emanuel ............ G01R 31/1236 |
| 10,686,308 | B1 | * | 6/2020  | Burks .................. H01R 9/2425 |
| 11,784,482 | B2 | * | 10/2023 | Ting ....................... H02H 7/228 |
|  |  |  |  | 361/107 |
| 2018/0356454 | A1 | * | 12/2018 | Burkman ............... G01R 31/66 |

* cited by examiner

*Primary Examiner* — Scott Bauer
(74) *Attorney, Agent, or Firm* — Robert Crownover

(57) ABSTRACT

Described are system and method embodiments for establishing a weak ground path, comprising: disabling a first ground path for a shield pin of a cable connection interface, the first ground path including a first switch; enabling a second ground path for the shield pin, the second ground path comprises a second switch, and the second ground path having a higher resistance than the first ground path; determining a connection of a device to the cable connection interface with the second ground path; and enabling the first ground path based on the connection of the device being determined.

20 Claims, 4 Drawing Sheets

SYSTEMS AND METHODS TO CABLE SHIELD FAULT DETECTION AND PROTECTION

CROSS-REFERENCE TO RELATED APPLICATION(S)

This is a Divisional of U.S. patent application Ser. No. 17/233,829 filed Apr. 19, 2021, which claims the benefit of priority to U.S. Provisional Patent Application No. 63/017,630 filed Apr. 29, 2020 for all common subject matter. The content of these applications is incorporated herein by reference in their entirety.

TECHNICAL FIELD

The present disclosure relates generally to systems and methods for cable shield fault detection.

BACKGROUND

Portable device cables, e.g. Universal Serial Bus (USB) Type-A, Type-C, micro-USB and Power Delivery Electronically Mark Cables (EMC's), are widely used in various applications. They may be used for device charging, data communication, etc. Typically, a portable device cable may comprise a power wire, a ground wire, one or more pairs of data wires, and a shield. During operation, one end of a portable device cable may be connected to a power source or an electronic device, e.g. a car charging port, desktop, a laptop. The other end of the portable device cable may be connected to a portable electronic device.

In certain situations, the shield of the portable device cable may accidentally short to a voltage. For example, in automobile applications, a USB ground short-to-battery may occur when one connector of a portable device cable is connected to a USB port of a vehicle, while the other connector of portable device cable accidentally falls into a 12V cigarette lighter receptacle. The shield of the connector may contact the 12V center terminal. As a result, a damaging amount of current may flow through the portable device cable from the cigarette lighter wiring. A shield ground switch may be used on the USB port side to disconnect the port ground from the shield to protect the USB port, cable and cigarette lighter.

A threshold voltage detector has been used to sense a current through the ground switch via a current sensing amplifier (CSA). The output of the threshold voltage detector may be used for controlling the shield ground switch. However, limitations exist for such an implementation. First, the shield ground switch may be falsely turned-off during load transients as the source for the currents through the shield ground switch may not be distinguished between a load current and a ground short current. Furthermore, for a shield ground switch using field-effect transistor (FET), a high drain-source voltage (VDS) may be required to handle high voltage rings that occur when the FET is turned-off promptly. Consequently, high voltage protection on the shield pin is also required.

Accordingly, it would be desirable to have systems and methods for cable shield fault detection for improved performance and better protection.

SUMMARY

Described are system and method embodiments for shield fault detection and protection to avoid high short currents flowing from a power source through the shield to ground during unexpected events. A threshold voltage detector and a slope detector may be used to sense the voltage on a ground switch connected between the shield and ground. A method to distinguish the ground switch current caused by the shield fault from normal operation is also discussed. In certain situations, a weak ground is established first to sense or identify a valid attachment on the cable before connecting to the real strong ground. The disclosed embodiments, separately or in combination, may effectively detect shield fault with improved performance, and may also help lowering system cost by using smaller size shield ground switch with lower current capability.

In one or more embodiments, the shield pin of the electronic device is grounded via a ground path comprising a shield ground switch. When the shield of the portable device cable shorts to a voltage source, a current flowing through the ground path develops a voltage at the shield pin. When the sensed voltage exceeds a threshold, a voltage comparator is triggered to report a fault condition to a fault control module, which then outputs a signal to cause, via a driver, the shield ground switch to switch off. In one or more embodiments, once the fault condition is removed or after a predetermined time interval, the shield ground switch is turned on again.

In one or more embodiments, both threshold and slope detectors are used for fast detection. By the time shield threshold detection triggers the shield ground switch to be turned off, current in the cable might be high enough to cause some damage to components. One way to reduce the damage is to detect the fault ahead of the threshold detector at lower thresholds. However, it is challenging for the threshold detector to use a lower threshold because such a lower threshold might be in the range of load operating transient envelop. In one or more embodiments, to achieve early detection with a lower threshold, a slope detector is implemented to compare a rate of voltage change on the shield to a reference slope. The slope detection may detect a fault when the sensed voltage at the shield pin is even less than the predetermined threshold when a fault, e.g. a short to battery, occurs. The slope detector triggers when the voltage change rate is faster than a reference slope. In a normal application, load current transient rates are typically less than fault current transient rate, and therefore, a predetermined fixed reference slope is sufficient.

In certain situations, such as hot plugin events with non-type-C connectors, where the output voltage of the DC-DC converter is at a fixed voltage may be at 5V, a non-fault shield current transit might be high enough to cause a false fault reporting. In one or more embodiment, to avoid the slope detector from responding to such non-fault shield current transits, a current sense circuit is used to detect the current from the output capacitor of DC-DC converter for distinguishing sources for the shield ground switch current. If the DC-DC converter inrush current is not detected, the rise in voltage at the shield pin is therefore due to a fault event.

In a typical type-C USB connection, a device connected at one end of the USB type-C cable may be determined by voltage drop on CC pins caused by the internal resistance ($R_D$) of the device (sink or portable device). During connection detection, the ground is needed to allow current flow. The shield ground switch shall be kept ON after system start-up and waiting for an attachment to happen. However, a strong cable ground through a shield ground switch may be vulnerable to shield-short-to-battery events. In one or more embodiments, a method of establishing a weak ground path to sense a valid attachment on the cable before connecting to the real strong ground path is disclosed. This method provides protection by avoiding high current flow via the strong ground path in an event of shield short fault.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

Reference will be made to exemplary embodiments that are illustrated in the accompanying figures. Those figures are intended to be illustrative, rather than limiting. Although the present disclosure is generally described in the context of those embodiments, it is not intended by so doing to limit the scope of the present disclosure to the particular features of the embodiments depicted and described.

Figure 1:
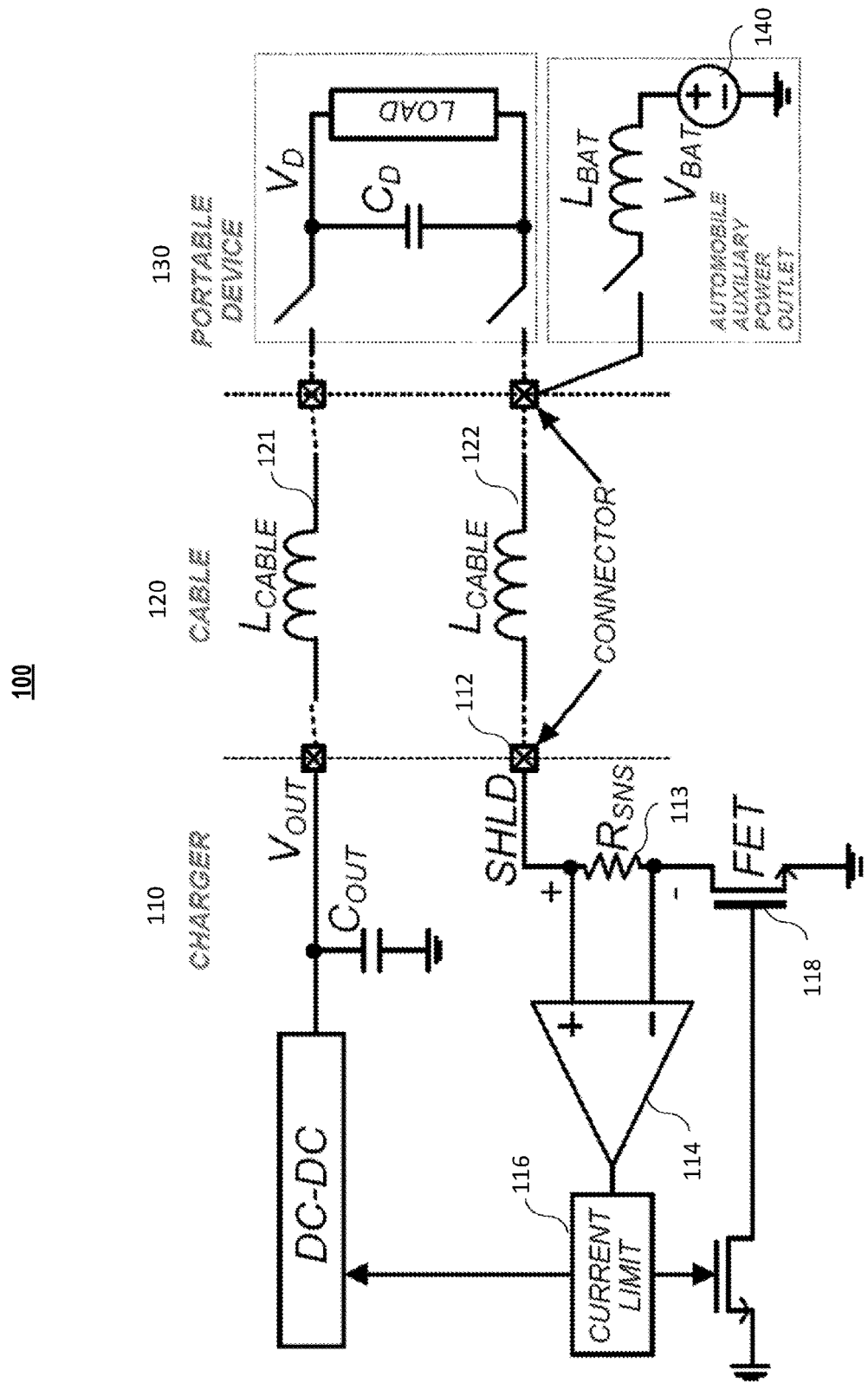
FIG. 1 depicts a prior art circuit with ground switch for shield fault protection.

One skilled in the art will recognize that various implementations and embodiments may be practiced in accordance with the specification. All of these implementations and embodiments are intended to be included within the scope of the disclosure.

DETAILED DESCRIPTION

In the following description, for purposes of explanation, specific details are set forth in order to provide an understanding of the invention. It will be apparent, however, to one skilled in the art that the invention can be practiced without these details. Furthermore, one skilled in the art will recognize that embodiments, described below, may be implemented in a variety of ways, such as a process, an apparatus, a system, a device, or a method on a tangible computer-readable medium.

Components, or modules, shown in diagrams are illustrative of exemplary embodiments and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. The terms "include," "including," "comprise," and "comprising" shall be understood to be open terms and any lists the follow are examples and not meant to be limited to the listed items.

Furthermore, one skilled in the art shall recognize that: (1) certain steps may optionally be performed; (2) steps may not be limited to the specific order set forth herein; (3) certain steps may be performed in different orders; and (4) certain steps may be done concurrently. More particularly, for the purposes of this disclosure, "connecting a ground path" must be understood as including and functionally equivalent to "maintaining a connected ground path"; and similarly, "disconnecting a ground path" must be understood as including and functionally equivalent to "maintaining a disconnected ground path". That is descriptions or claims describing a connection, connecting, or connects should be construed to cover a pre-existing connection. To the same point, descriptions or claims describing a disconnection, disconnecting, or disconnects should be construed to cover a pre-existing disconnection.

FIG. 1 depicts a prior art circuit with ground switch for shield fault protection. A portable device 130 couples to a charger or DC-DC converter 110 via a cable 120 which may be a USB cable comprising at least a power wire 121, a ground wire 122. In certain situations, the shield of the cable may accidentally short to a voltage. For example, in an automobile application, a USB ground short-to-battery may occur when one connector of a portable device cable is connected to a USB port of a vehicle, while the other connector of portable device cable accidentally falls into a 12V cigarette lighter receptacle 140. The shield of the connector may contact the 12V center terminal. As a result, a damaging amount of current may flow through the portable device cable from the cigarette lighter wiring. A shield ground switch 118 is incorporated within the charger (a USB port) to disconnect the port ground from the shield to protect the USB port, cable and cigarette lighter. The shield ground switch 118 may be used in combination with a pull-up resistor for voltage control purpose. A current sensing amplifier (CSA) 114 has been used to sense a current through the ground switch via a current sensing resistor $R_{SNS}$ 113. The output of the CSA 114 is fed into a current limit circuit 116 for comparison with a predetermined threshold. The comparison result is used for controlling the shield ground switch 118.

Limitations exist for such an implementation. First, the shield ground switch may be falsely turned-off during load transients as the shield ground switch may not distinguish between a ground short current and a load current, which could be high at certain normal transient events. Furthermore, for a shield ground switch using field-effect transistor (FET), a high drain-source voltage ($V_{DS}$) may be required to handle high voltage rings that occur when the FET is turned-off promptly. Consequently, high voltage protection on the shield pin is also required. Furthermore, to avoid communication corruption on data lines that are referenced to ground, a FET with low on resistance $R_{DSON}$ has to be used to limit the DC voltage shift on the ground. A FET with large current capacity is therefore needed, which inevitably increases cost for such a shield ground detection circuit.

Figure 2:
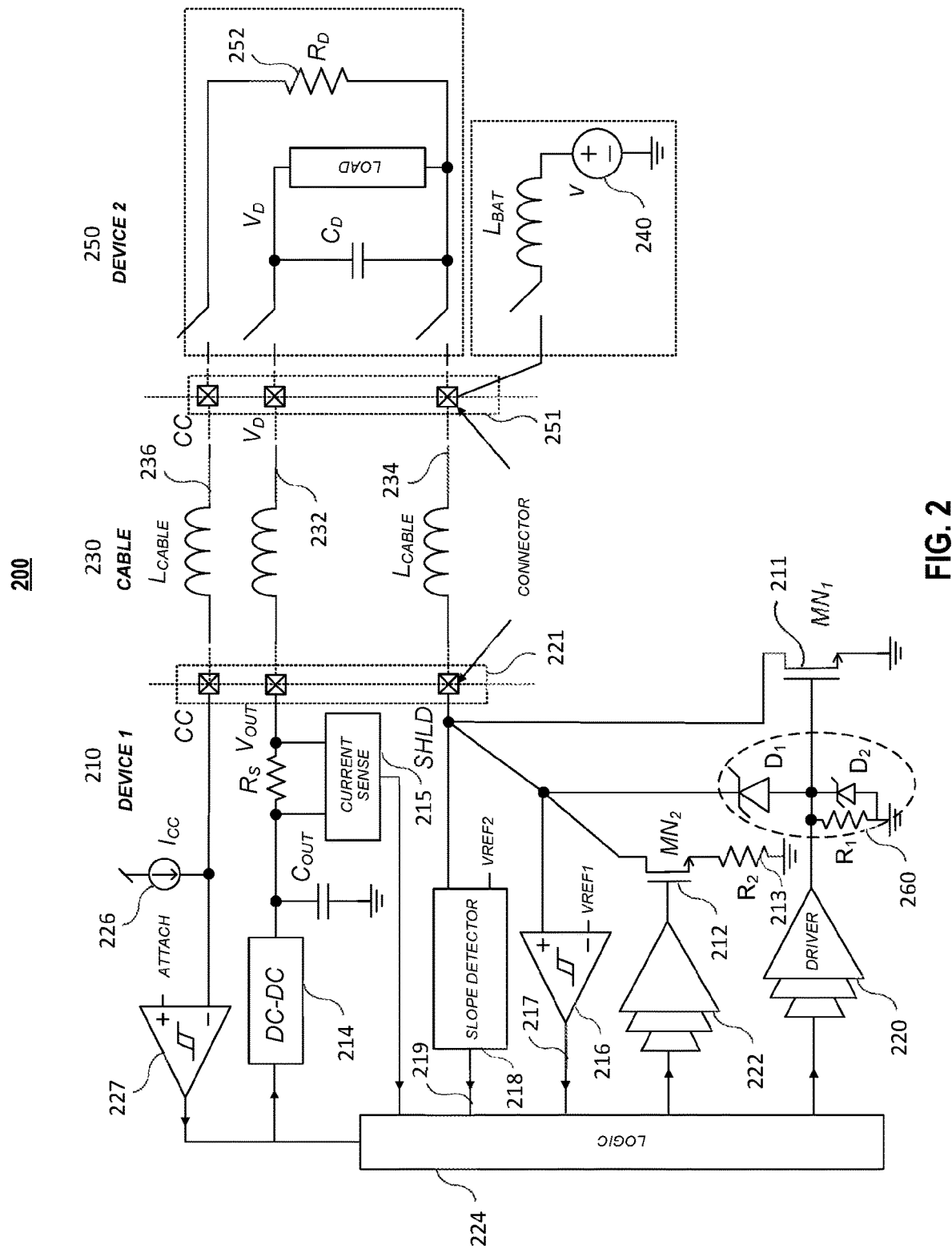
FIG. 2 depicts a circuit with various components for shield fault detection and protection according to various embodiments.

FIG. 2 depicts a circuit with various components for shield fault detection and protection according to various embodiments. As shown in FIG. 2, a first device 210 couples to a second device 250 via a cable 230 comprising multiple wires. The first device 210 may be a USB port within an automobile for charging and/or data communication. The second device 250 may be a portable device, such as a smartphone, a tablet, etc. The cable 230 may be a type-A, type-B, micro-B, or type-C USB cable, or a lightning cable, etc. The cable 230 may comprise at least a power wire 232 and a shield wire 234, which connect a power pin ($V_{OUT}$) and a shield pin of a cable connection interface 221 at the first device and corresponding pins of a cable connection interface 221 at the second device. In one or more embodiments, the cable connection interface 221 may be a type-A USB port, a type-B USB port, a type-C USB port, a mini USB port, a micro USB port, a lightning connector, or other types of multi-pin port having a shield connection. Although the wires 232, 234, and 236 of the cable 230 are represented with incorporation of an inductor ($L_{CABLE}$), one skilled in the art shall understand that the inductance may be small, substantially close to zero, or practically be zero. Such variations shall still be within the scope of the disclosure.

In one or more embodiments, the first device 210 comprises a first shield ground switch 211 coupled to the shield (SHLD) pin (or connector) to switchably establish a first ground path for the shield pin. The first ground path is also referred as a strong ground since the grounding resistance for the first ground path is the on resistance of the first shield ground switch 211, which is very small. The first device 210 may further comprise a threshold voltage detector 216 coupled to the shield (SHLD) pin. The threshold voltage detector 216 senses a voltage of the shield pin for comparison to a reference voltage (shown as $V_{REF1}$ in FIG. 2) and outputs a voltage comparison signal 217 to a logic control module 224. In one or more embodiments, the threshold voltage detector 216 is a voltage comparator that may have hysteresis. When the voltage of the shield pin is above the reference voltage in a fault event of shield short to a power source 240, the logic control module 224 receives the voltage comparison signal from the threshold voltage detector 216 and outputs a signal to switch off, via a first switch driver 220, the first shield ground switch 211 to decouple the shield pin from the ground. In one or more embodiments, the first device 210 may operate as a charge port and comprise a DC converter 214 coupled to the power pin to provide voltage to the second device 250 via the cable 230. The logic control module 224 is to be understood herein as a physical structural component at least having transistor logic gates for providing computation and control. Furthermore, the logic control module 224 includes structural inputs and outputs typically operating between zero and five volts. It is contemplated that the logic control module 224 can be a TTL or CMOS based architecture but could also include other logic families including RTL, DTL, and ECL, for example.

In one or more embodiments, the first device 210 may also comprise a slope detector 218 coupled to the shield (SHLD) pin to detect a rate of voltage change on the shield pin. The slope detector 218 compares the detected rate to a reference slope (shown as $V_{REF2}$ in FIG. 2) and outputs a slope comparison signal 219 to the logic control module 224. The rate of voltage change on the shield pin is also an indicator of a slew rate for the current through the shield ground switch because when the shield ground switch is on, the voltage at the shield pin is basically linearly related to the current through the shield ground switch by an on resistance of the switch. In one or more embodiments, the slope detector 218 is incorporated with hysteresis for slope comparison. When the detected rate is above the reference slope in a fault event of shield short to the power source 240, the logic control module 224 receives the slope comparison signal from the slope detector 218 and outputs a signal to switch off, via a first switch driver 220, the first shield ground switch 211 to decouple the shield pin from the ground. Compared to threshold voltage detection, the slop detection may provide faster reaction for a shield fault event because by the time the threshold detection triggers the shield ground switch to be turned off, current in the cable might be high enough to cause some damage to components. It may be challenging for the threshold detector to use a lower threshold because such a lower threshold might be in the range of load operating transient envelope. The slope detection may detect a fault when the sensed voltage at the shield pin is even less than the predetermined threshold when a fault, e.g. a short to battery, occurs. The slope detector triggers when the rate of voltage change is faster than a reference slope. In normal application, load current transient rates are typically less than fault current transient rate, and therefore, a fixed reference slope is sufficient. The slope detector 218 is to be understood herein as a physical structural component including physical structures such as switching elements, amplifiers, differentiators, resistors or capacitors.

In one or more embodiments, the threshold voltage detector 216 and the slope detector 218 may be used separately or in combination for shield fault detection. Correspondingly, the logic control module 224 may be triggered by the threshold voltage detector 216 and the slope detector 218 individually (e.g. like an OR gate), or jointly (e.g. like an AND gate).

In certain situations, such as hot plugin events with non-type-C connectors, where an output voltage of a DC-DC converter 214 within the first device 210 is at a fixed voltage of 5V, a non-fault shield current transit might be high enough to trigger a false fault reporting. In one or more embodiment, to avoid the slope detector 218 from responding to such non-fault shield current transients, a current sense circuit 215 is used to detect, via a sensing resistor ($R_S$) coupled between the DC converter and the power pin, current from the DC-DC converter through the power pin for differentiation. That is, the current sense circuit detects whether or not a current is flowing through a power pin of the cable connection interface. The logic control module 224 couples to receive an output from the current sense circuit 215 for assistance in shield fault detection. If the DC-DC converter inrush current is either not detected or has a changing rate less than the detected slew rate for the current through the shield ground switch, the rise in voltage at the shield pin is therefore due to a fault event. The incorporation of output current sense together with slope detection may effectively prevent false fault reporting, and thus improve the reliability for fault detection. The current sense circuit 215 is to be understood herein as a physical structural component at least having structural input and output connections. However, many forms of the current sense circuit are contemplated including Hall effect linear sensors, galvanically isolated sensors, or GMR-based sensors. Yet other forms are contemplated including fluxgate sensors, shunt resistors, and even fiber optic interferometer based sensors.

In one or more embodiments, the first device 210 further comprises a clamp 260 coupled to the first shield ground switch 211 to limit peak voltage on the shield pin. The clamp may comprise a first Zener diode (D1) connected between the gate and drain of the first shield ground switch 211 and a second Zener diode (D2) connected between the gate and ground. In one or more embodiments, a parallel resistor ($R_1$) may couple to D2 in parallel. The clamp helps in limiting drain voltage when the first shield ground switch 211 is open. Once the drain voltage reaches the Zener diode voltage limit, it automatically closes the first shield ground switch 211 to dissipate energy left in the cable 230 and thus protects both the switch 211 and the first device 210.

In one or more embodiments, the shield pin of the electronic device may be grounded via a second ground path comprising a second shield ground switch 212 and a series resistor 213. The logic control module 224 couples to the second shield ground switch 212 via a second switch driver or logic circuit 222 for switch control. In one or more embodiments, the logic control module 224 may selectively turn on the first shield ground switch 211 or the second shield ground switch 212 for a desired grounding path between the first ground path and the second ground path. In one or more embodiments, the logic control module 224 may turn on both the first shield ground switch 211 and the second shield ground switch 212 to enable both grounding paths. The logic control module 224 enables the first ground path through the first shield ground switch 211 based on a determination of a connection of a device with the comparators 227, and the logic control module 224 disables the second ground path through the second shield ground switch 212 based on the determination of the connection of the device. In one or more embodiments, the first shield ground switch 211 and the second shield ground switch 212 may be turned on together, alternatively turned on, or turned off together. In one or more embodiments, the second ground path may comprise the second shield ground switch 212 without the series resistor 213, with the on resistance of the second shield ground switch 212 larger than the first shield ground switch 211, such that the second ground path is still a weak ground path compared to the first ground path.

When the shield of the portable device cable shorts to a voltage source, a current flowing through ground path develops a voltage at the shield pin. When the sensed voltage exceeds a threshold, a voltage comparator is triggered to report a fault condition to a fault control module, which then outputs a signal to cause, via a driver, the shield ground switch to switch off. In one or more embodiments, once the fault condition is removed or after a predetermined time interval, the shield ground switch is turned on again.

In one or more embodiments, for a typical type-C USB connection, two configuration channel (CC) pins are included within the connection interface or receptacle 221, and a CC wire 236 on the cable 230, are used to establish and manage a source-to-sink connection. The second device 250 connected to the first device 210 by a USB type-C cable may be determined by voltage drop on CC pins caused by the internal resistance or a pull-down resistor ($R_D$) 252 within the device 250, which may be a sink or portable device. The comparators 227 determine the voltage drop across the CC pins caused by internal resistance within the device. For simplicity, only the connected CC pin is shown in FIG. 2. One skilled in the art shall understand wirings for type-C USB connection.

During connection detection, ground is needed to allow current flow from a current source 226 through the connected CC pin to the resistor 252. The first device monitors, using two comparators 227 (for simplicity, only one comparator shown in FIG. 2), both pins for a voltage lower than an unterminated voltage. In one or more embodiments, voltage greater than or equal to 2.75V, is treated as unterminated (e.g. not a valid plug-in). Once such a voltage drop is monitored, the comparators 227 send a result to the logic control module 224 to indicate that either a Sink, a powered cable, or a sink connected via a powered cable has been attached to the first device. That is, the comparators 227 determine a connection of a device to the cable connection interface with the second shield ground switch 212 of the second ground path. In one or more embodiments, the current source 226 is withdrawn from operation to save power upon completion of attachment detection. The shield ground switch shall be kept ON after system start-up waiting for a second device connection and during the detection of connection. However, a strong ground path through the first shield ground switch 211 may be vulnerable to shield-short-to-battery events. In one or more embodiments, a second ground path through the second shield ground switch 212 is established first to sense a valid attachment on the cable. The second ground path may also be referred as a weak ground since the grounding resistance for the second ground path is the sum of the on resistance of the second shield ground switch 212 and the series resistor 213. The grounding resistance for the second ground path is larger than the grounding resistance for the first ground path. After attachment established, the second shield ground switch 212 is switched off and the strong ground through the first shield ground switch 211 is established. Such a grounding implementation provides protection by avoiding high current flow from the battery that is shorted to cable to strong shield FET ground.

The first shield ground switch 211 or the second shield ground switch 212 can disconnect a ground path of the shield pin based on the rate of voltage change being above or larger than the reference slope $V_{REF2}$ and the current through the power pin not being detected, and the first shield ground switch 211 or the second shield ground switch 212 connects the ground path based on the rate of voltage change being above or larger than the reference slope $V_{REF2}$ and the current through the power pin being detected.

Figure 3:
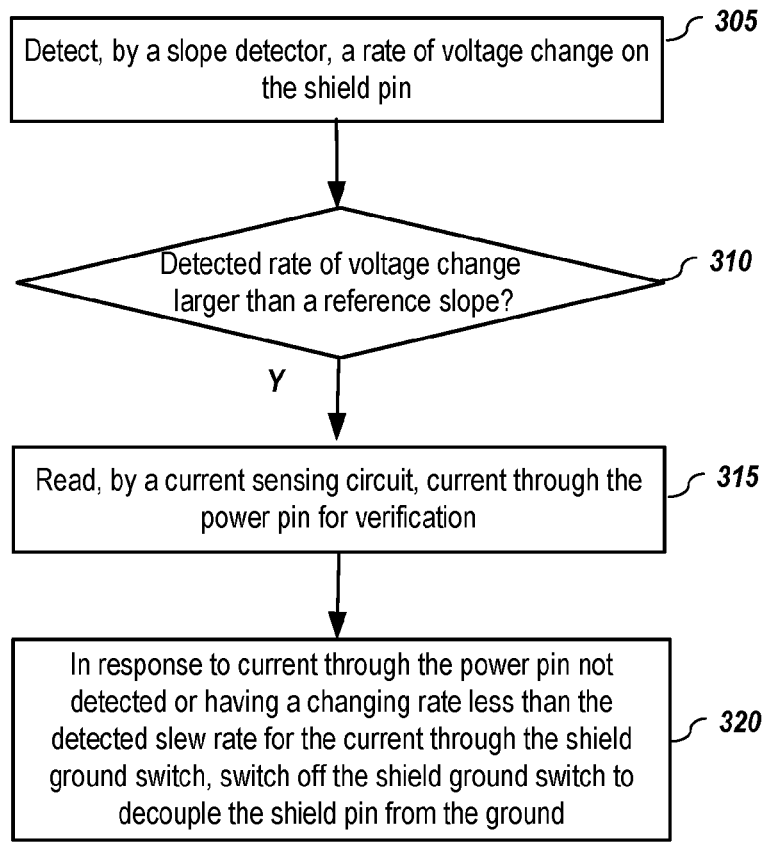
FIG. 3 depicts an operation process for shield fault detection and protection according to various embodiments.

FIG. 3 depicts an operation process for shield fault detection and protection according to various embodiments. For the first device 210 having a cable connection interface comprising a shield pin grounded via a shield ground switch, a rate of voltage change on the shield pin is detected, by a slope detector in step 305. The slope detector compares the detected rate of voltage change to a reference slope in step 310. In response to the detected rate larger than the reference slope, current through the power pin is read (e.g., sensed) by a current sensing circuit in step 315 for verification or differentiation. In response to current through the power pin not detected or having a changing rate less than the detected slew rate for the current through the shield ground switch, the logic control module outputs a signal to switch off the shield ground switch to decouple the shield pin from the ground in step 320. In one or more embodiments, once a fault condition is removed or after a predetermined time interval, the shield ground switch is turned on again.

Figure 4:
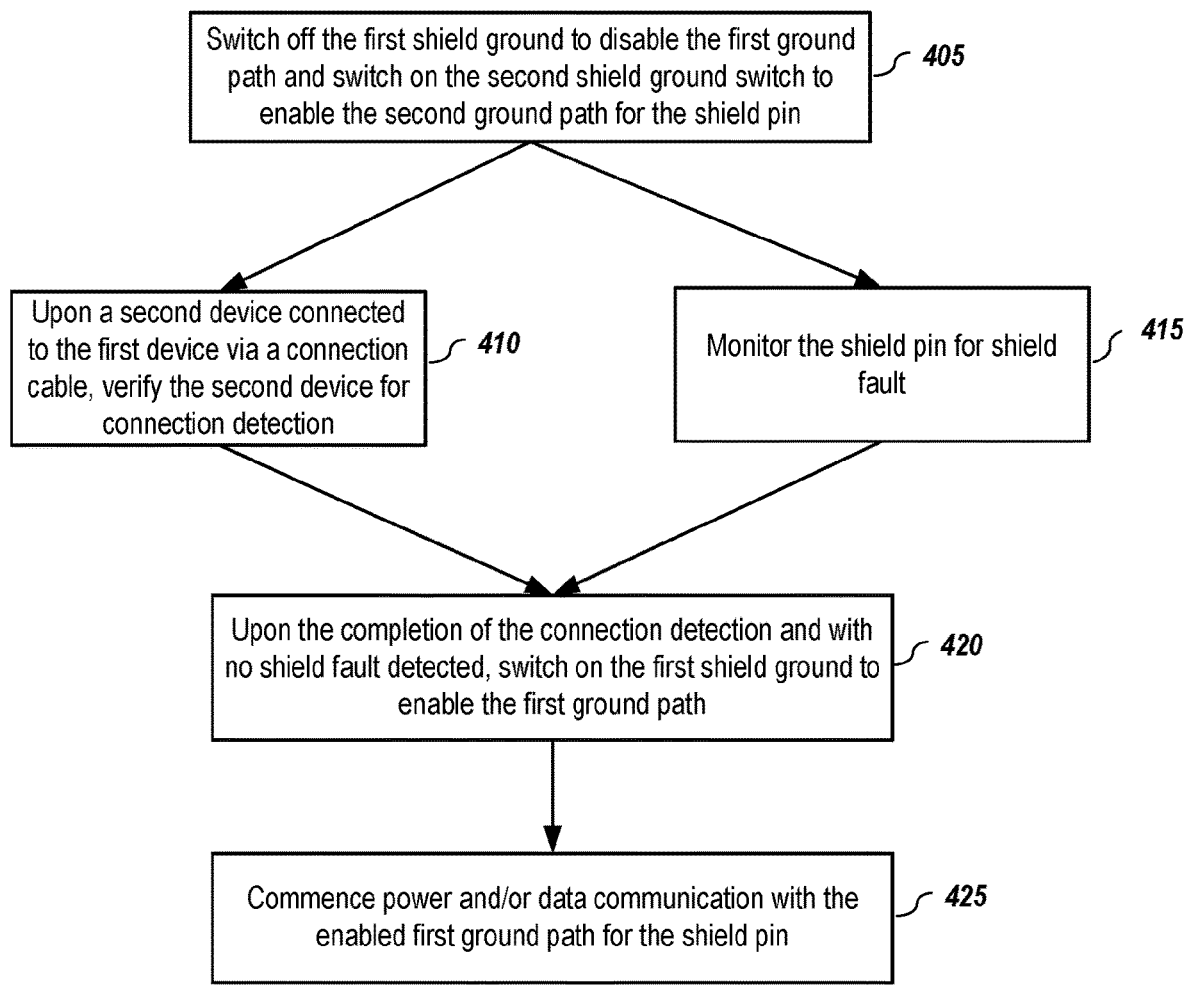
FIG. 4 depicts an operation process of establishing a weak ground path before a strong ground path for shield fault protection according to various embodiments.

FIG. 4 depicts an operation process of establishing a weak ground path before a strong ground path for shield fault protection according to various embodiments. In step 405, the first shield ground switch is switched off to disable the first ground path and the second shield ground switch is switched on to establish the second ground path for the shield pin. The second ground path has a grounding resistance larger than the first ground resistance. In step 410, upon a second device connected to the first device via a connection cable, the second device is verified for connection detection. In one or more embodiments, the verification for connection detection may comprise aforementioned process of determining voltage drop on CC pins when currents flow from the current source 226 through the CC pin and the resistor 252 within the second device 250. While the first device powers up awaiting for second device connection and during the connection detection, the shield pin is monitored for shield fault in step 415, using one or more aforementioned methods including threshold detection, slop detections, current sensing, etc. Upon the completion of the connection detection and with no shield fault detected, the second shield ground switch is either switched off to disable the second ground path or kept on, and the first shield ground switch is switched on to establish the first ground path for the shield pin in step 420. In one or more embodiments, the second shield ground may be always kept ON to have ground path available even during transition phases. In step 425, the first device and the second device may commence power and/or data communication with the first ground path enabled for the shield pin.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A method of establishing a weak ground path, comprising:
    disabling a first ground path for a shield pin of a cable connection interface, the first ground path including a first switch;
    enabling a second ground path for the shield pin, the second ground path comprises a second switch, and the second ground path having a higher resistance than the first ground path;
    determining a connection of a device to the cable connection interface with the second ground path; and
    enabling the first ground path based on the connection of the device being determined.

2. The method of claim 1 wherein enabling the second ground path includes enabling the second ground path having a resistor coupled to the second switch in series.

3. The method of claim 1 wherein enabling the second ground path includes enabling the second ground path with the second switch having an on resistance larger than the first switch.

4. The method of claim 1 further comprising monitoring the shield pin for a rate of voltage change using the second ground path.

5. The method of claim 1 further comprising disabling the second ground path based on the connection of the device being determined.

6. A method of establishing a weak ground path, comprising:
    disabling a first ground path for a shield pin of a cable connection interface, the first ground path including a first switch;
    enabling a second ground path for the shield pin, the second ground path comprises a second switch, and the second ground path having a higher resistance than the first ground path;
    determining a connection of a device to the cable connection interface with the second ground path;
    enabling the first ground path based on the connection of the device being determined; and
    limiting peak voltage on the shield pin with a clamp.

7. The method of claim 6 wherein limiting the peak voltage with the clamp includes limiting the peak voltage with a first diode connected between a gate and a drain of the first switch.

8. The method of claim 7 wherein limiting the peak voltage with the clamp includes limiting the peak voltage with a second diode connected between the gate and a ground.

9. The method of claim 8 wherein limiting the peak voltage with the clamp includes limiting the peak voltage with a resistor coupled to the second diode in parallel.

10. The method of claim 6 wherein determining the connection of the device includes determining a voltage drop across a configuration channel pin caused by internal resistance within the device.

11. A weak ground path system, comprising:
    a first switch, the first switch disables a first ground path for a shield pin of a cable connection interface;
    a second switch, the second switch enables a second ground path for the shield pin, and the second ground path having a higher resistance than the first ground path;
    a comparator, the comparator determines a connection of a device to the cable connection interface with the second ground path; and
    a logic control module, the logic control module enables the first ground path based on the connection of the device being determined.

12. The system of claim 11 wherein the second ground path includes a resistor coupled to the second switch in series.

13. The system of claim 11 wherein the second ground path includes the second switch having an on resistance larger than the first switch.

14. The system of claim 11 further comprising a slope detector, the slope detector monitors the shield pin for a rate of voltage change using the second ground path.

15. The system of claim 11 wherein the logic control module disables the second ground path based on the connection of the device being determined.

16. The system of claim 11 further comprising a clamp, the clamp limits a peak voltage on the shield pin.

17. The system of claim 16 wherein the clamp includes a first diode connected between a gate and a drain of the first switch.

18. The system of claim 17 wherein the clamp includes a second diode connected between the gate and a ground.

19. The system of claim 18 wherein the clamp includes a resistor coupled to the second diode in parallel.

20. The system of claim 16 wherein the comparator determines a voltage drop across a configuration channel pin caused by internal resistance within the device.

\* \* \* \* \*